United States Patent
Park et al.

[11] Patent Number: 5,879,982
[45] Date of Patent: Mar. 9, 1999

[54] METHODS OF FORMING INTEGRATED CIRCUIT MEMORY DEVICES HAVING IMPROVED ELECTRICAL INTERCONNECTS THEREIN

[75] Inventors: In-sun Park; Byung-hee Kim; Se-jun Oh; Sang-min Lee, all of Seoul, Rep. of Korea

[73] Assignee: Samsung Electronics Co., Ltd., Suwon, Rep. of Korea

[21] Appl. No.: 948,566

[22] Filed: Oct. 10, 1997

[30] Foreign Application Priority Data

Dec. 17, 1996 [KR] Rep. of Korea .................. 1996-66950

[51] Int. Cl.$^6$ .............................................. H01L 21/8242
[52] U.S. Cl. .......................... 438/241; 438/240; 438/653
[58] Field of Search ................................ 438/3, 240, 241, 438/253, 643, 653

[56] References Cited

U.S. PATENT DOCUMENTS

| | | | |
|---|---|---|---|
| 5,296,399 | 3/1994 | Park | 438/241 |
| 5,366,920 | 11/1994 | Yamamichi et al. | 438/240 |
| 5,550,072 | 8/1996 | Cacharelis et al. | 438/241 |
| 5,593,914 | 1/1997 | Evans, Jr. et al. | 438/240 |

*Primary Examiner*—Chandra Chaudhari
*Attorney, Agent, or Firm*—Myers Bigel Sibley & Sajovec

[57] ABSTRACT

Methods of forming integrated circuit memory devices include the steps of forming a first electrically insulating layer on a semiconductor substrate containing memory cells in a memory cell array region and peripheral circuits for driving the memory cells in a peripheral circuit region adjacent the memory cell array region. An etch-stopping layer is then formed on the first electrically insulating layer and then steps are performed to form a first electrically conductive layer on the etch-stopping layer, form a ferroelectric layer on the first electrically conductive layer, form a second electrode layer on the ferroelectric layer, etch the second electrode layer and ferroelectric layer in sequence using a first mask to define a second electrode and then etch the first electrically conductive layer using a second mask to simultaneously define a first electrode and a first interconnection layer comprising the same material. A second electrically insulating layer is then formed on the second electrode and first interconnection layer. First and second vias are then formed in the second electrically insulating layer, to expose the second electrode and first interconnection layer, respectively. A second electrically conductive layer is then patterned in the first and second vias.

9 Claims, 3 Drawing Sheets

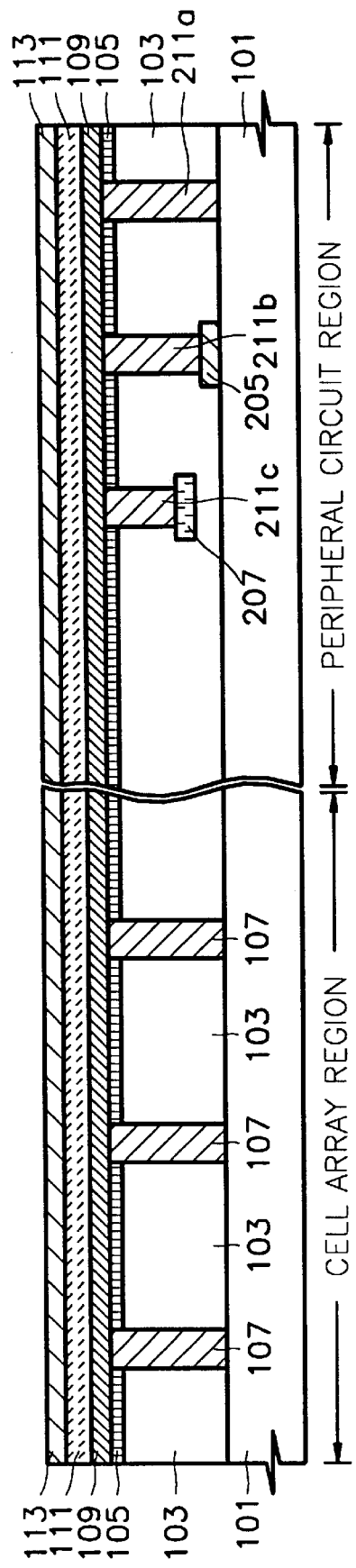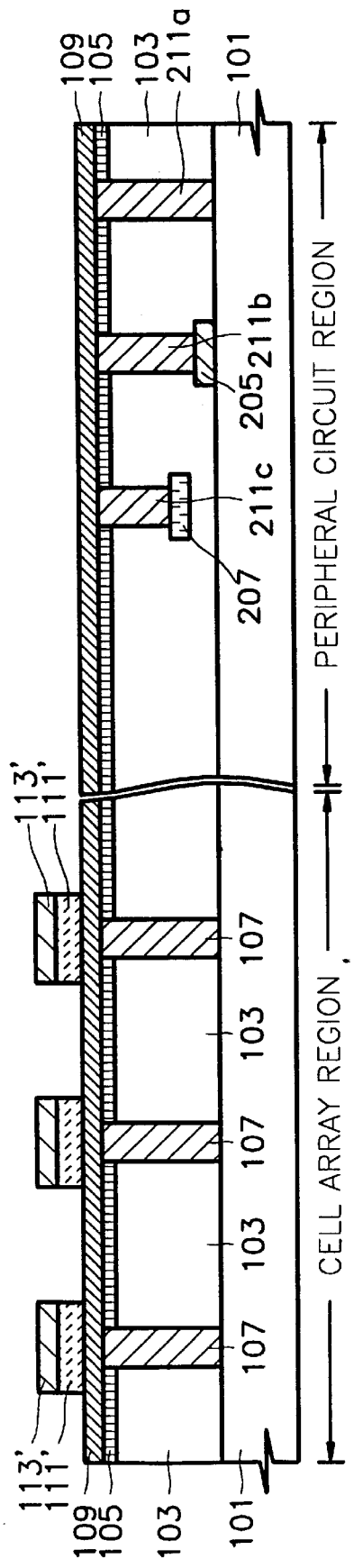

METHODS OF FORMING INTEGRATED CIRCUIT MEMORY DEVICES HAVING IMPROVED ELECTRICAL INTERCONNECTS THEREIN

FIELD OF THE INVENTION

The present invention relates to methods of forming integrated circuit devices and devices formed thereby, and more particularly to methods of forming electrical interconnects for integrated circuit devices.

BACKGROUND OF THE INVENTION

With the increase in integration density in dynamic random access memory (DRAM) and a ferroelectric RAM (FRAM) devices, ferroelectric materials such as PZT ((Pb, Zr)TiO$_3$) or BST ((Ba,Sr)TiO$_3$) have typically been used as dielectric films in storage capacitors. Ferroelectric material has spontaneous polarization, in contrast to conventional oxide films such as silicon nitride film or tantalum pentoxide film, and generally has a high dielectric constant of several hundred to 1000.

The upper and lower electrodes of a ferroelectric capacitor are generally composed of Pt-group elements. The lower electrode of the ferroelectric capacitor is typically connected to a contact plug composed of polysilicon or tungsten, and the upper electrode thereof is typically connected to a metal interconnection layer composed of aluminum. However, platinum (Pt) composing the upper and lower electrodes reacts with aluminum and this reaction can degrade the polarization characteristics of the ferroelectric capacitor. To avoid this problem, a barrier layer is typically provided between the electrode of the ferroelectric capacitor and aluminum metal interconnection layer. Also, to enhance contact resistance in forming a metal interconnection, an ohmic layer such as a Ti layer is interposed between the barrier layer and the upper electrode.

Hereinbelow, a structure of a semiconductor device having a conventional ferroelectric capacitor therein will be described with reference to FIG. 1. FIG. 1 is a sectional view for explaining metal interconnections in a cell array region and a peripheral circuit region. As shown in FIG. 1, in the cell array region there are provided a transistor including a field oxide film 2, source and drain regions 3 and 5 and a gate electrode 7 functioning as a word line, and a bit line 11 on a semiconductor substrate 1. A first interlayer dielectric (ILD) 13 and a second ILD 15 each having a storage contact hole are sequentially deposited over the transistor. A tungsten plug 17 is formed to fill the storage contact hole, and a lower electrode 19, a ferroelectric film 21 and an upper electrode 23 are sequentially formed on the tungsten plug 17 to provide the ferroelectric capacitor. A diffusion preventing film 24 is provided on the top and sides of the ferroelectric capacitor. A first intermetal dielectric (IMD) 27 and a second IMD 29 having via holes therein are sequentially formed over the ferroelectric capacitor. A second metal interconnection 31 is formed to fill the via holes. A Ti layer 25 is formed on the ferroelectric capacitor as an ohmic layer. A TiN layer 33 is interposed over the ohmic layer as a barrier layer. Thus, a Ti/TiN layer is interposed between the upper electrode 23 of the capacitor and the second metal interconnection 31.

Referring still to FIG. 1, in the peripheral circuit region adjacent to the cell array region, gate electrodes 7 and 9 and a bit line 11 are formed on the semiconductor substrate 1 on which the field oxide film 2 is formed. A first ILD 13, a second ILD 15 and a first IMD 27 each having a contact hole, are sequentially formed thereon. A first metal interconnection is formed through the contact hole. It is understood from FIG. 1 that the step height of the contact hole in the peripheral circuit region may be large, for example, about 1.5 μm. If the step height is increased to such an extent, a void may be produced in the contact hole when filling the same with metal. A second IMD 29 having a via hole is formed over the first metal interconnection 35, and a second metal interconnection 31 is filled in the via hole to then be connected to a predetermined portion of the first metal interconnection 35. At this time, in order to improve contact resistance between metals, a Ti layer 25 as an ohmic layer is interposed therebetween. Also, a TiN layer 33 is interposed, over the ohmic layer, as a barrier layer.

As seen from FIG. 1, each via hole is formed in the cell array region and the peripheral circuit region after forming the first metal interconnection 35 and the second IMD 29. At this time, the portion where the via hole is formed extends opposite upper electrode 23 of the ferroelectric capacitor in the cell array region, and extends opposite the first metal interconnection 35 in the peripheral circuit region. The second metal interconnection 31 composed of aluminum is deposited in the via holes. Before the second metal interconnection 31 is deposited in the via holes, the Ti layer 25 as the ohmic layer and the TiN layer 33 as the barrier layer are deposited on the bottoms thereof. Therefore, the bottom of the via hole will have a stacked metal structure of Ti/TiN/Al.

However, if the Ti layer is deposited on the bottom of the via hole as described above, the residual polarization characteristics of the ferroelectric capacitor may still be deteriorated during a subsequent high temperature thermal treatment process following the formation of the capacitor. This is thought to be caused by defects in the perovskite structure of the ferroelectric film due to the diffusion of Ti through Pt. To solve the problem caused by Ti diffusion, there has been proposed a method of using only Al to form the second metal interconnection without using the Ti/TiN layer. However, as described above, Al also reacts with Pt during the thermal treatment process and deteriorates the polarization characteristics of the ferroelectric capacitor.

To solve the above-mentioned problem of Ti diffusion, there has been proposed another method of using aluminum (Al) and only a TiN layer as a barrier layer, without using a Ti layer as an ohmic layer in forming a second metal interconnection. According to this method, the polarization characteristics of a ferroelectric capacitor are maintained. However, this method has a drawback because via contact resistance is typically increased when the Ti ohmic layer is omitted.

Thus, according to currently developed metal interconnection technologies, it is quite difficult to maintain the polarization characteristics of ferroelectric capacitors in cell array regions and also improve contact resistance in peripheral circuit regions.

SUMMARY OF THE INVENTION

It is therefore an object of the present invention to provide improved methods of forming integrated circuit memory devices and devices formed thereby.

It is another object of the present invention to provide methods of forming integrated circuit memory devices having storage capacitors with improved electrical characteristics and devices formed thereby.

It is still another object of the present invention to provide methods of forming integrated circuit memory devices having ferroelectric capacitors with improved long term reliability and devices formed thereby.

These and other objects, advantages and features of the present invention are provided by methods of forming integrated circuit memory devices that include the steps of forming a first electrically insulating layer on a semiconductor substrate containing memory cells in a memory cell array region and peripheral circuits for driving the memory cells in a peripheral circuit region adjacent the memory cell array region. An etch-stopping layer is then formed on the first electrically insulating layer and then steps are performed to form a first electrically conductive layer on the etch-stopping layer, form a ferroelectric layer on the first electrically conductive layer, form a second electrode layer on the ferroelectric layer, etch the second electrode layer and ferroelectric layer in sequence using a first mask to define a second electrode and then etch the first electrically conductive layer using a second mask to simultaneously define a first electrode and a first interconnection layer. A second electrically insulating layer is then formed on the second electrode and first interconnection layer. First and second vias are then formed in the second electrically insulating layer, to expose the second electrode and first interconnection layer, respectively. A second electrically conductive layer is then patterned in the first and second vias.

According to one embodiment of the present invention, the step of forming a first electrically insulating layer comprises forming a first electrically insulating layer having first and second contact holes therein extending opposite the array region and peripheral circuit region, respectively, and forming first and second conductive contact plugs in the first and second contact holes, respectively. The step of patterning the second electrically conductive layer in the first and second vias is also preceded by the step of forming TiN diffusion barrier regions in the first and second vias. According to a preferred aspect of the present invention, these TiN diffusion barrier regions prevent the subsequent migration of aluminum atoms into the second electrode and the occurrence of chemical reactions which may deteriorate the dielectric characteristics of the ferroelectric layer. According to other preferred aspects of the present invention, the step of patterning the first electrically conductive layer comprises the step of depositing a layer of platinum on the etch-stopping layer so that the need for a titanium ohmic layer can be eliminated. The step of patterning a second electrically conductive layer also preferably includes the steps of depositing a layer of aluminum in the first and second vias, in contact with the TiN diffusion barrier regions.

BRIEF DESCRIPTION OF THE DRAWINGS

FIGS. 2A–2D are cross-sectional views of intermediate structures that illustrate a method of forming an integrated circuit memory devices according to an embodiment of the present invention.

DESCRIPTION OF PREFERRED EMBODIMENTS

Figure 1:
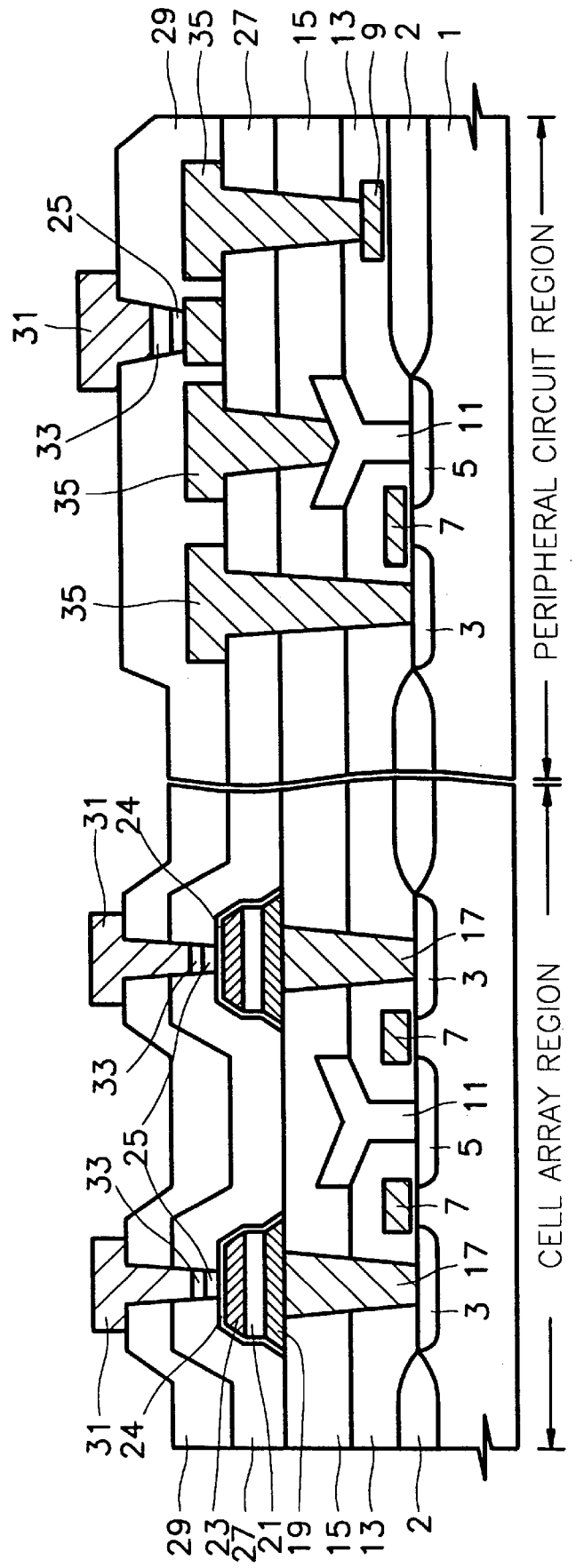
FIG. 1 illustrates a cross-sectional view of an integrated circuit memory device according to the prior art.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Referring to FIG. 2A, a first interlayer insulating layer 103 having storage contact holes therein, and an etching stop layer 105 are sequentially deposited in a cell array region of a semiconductor substrate 101. The storage contact holes are filled with a conductive material such as tungsten or polysilicon, to thereby form a contact plug 107.

A gate 205 and a bit line 207 are also formed in a peripheral circuit region of the semiconductor substrate 101, and a first interlayer insulating layer 103 is formed thereon. Contact holes exposing the semiconductor substrate 101, gate 205 or bit line 207 are also formed in the first interlayer insulating layer 103. Contact plugs 211a, 211b and 211c are formed for electrically contacting the semiconductor substrate 101, gate 205 and bit line 207, respectively. The contact plugs 211a, 211b and 211c may be formed by depositing a blanket layer of tungsten on the etch stop layer 105 and then performing a chemical mechanical polishing (CMP) or an etch-back process. The etch-back or CMP process is typically performed until the surface of the etching stop layer 105 is exposed.

A first metal layer 109, a ferroelectric material layer 111 and an upper electrode material layer 113 are sequentially deposited over the resultant structures in the cell array region and the peripheral circuit region. The first metal layer 109 is patterned as a lower electrode of a capacitor in the cell array region and is formed as a local interconnection region in the peripheral circuit region. The first metal layer 109 and the upper electrode material layer 113 are preferably composed of Pt-group elements having an anti-oxidation property. The ferroelectric material layer 111 may be made of a material having a perovskite structure such as BST or PZT.

Referring to FIG. 2B, the upper electrode material layer 113 and a ferroelectric material layer 111 are photo-etched, thereby forming an upper electrode 113' and a ferroelectric layer 111' opposite a contact plug 107 in the cell array region, and removing the upper electrode material 113 and the ferroelectric material layer 111 from the peripheral circuit region.

Figure 2C:
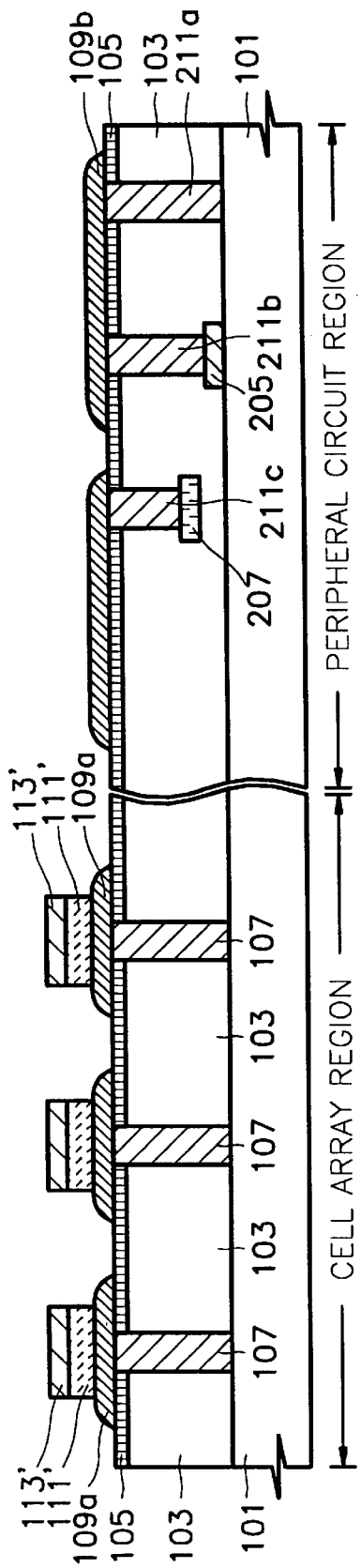

Referring to FIG. 2C, the first metal layer 109 is then patterned to form a lower electrode 109a of the capacitor in the cell array region and a first metal interconnection 109b as a local interconnection, in the peripheral circuit region. As shown in FIG. 2C, the local interconnection of the present invention, i.e., the first metal interconnection 109b, is formed over the first interlayer insulating layer 103. The thickness of the first interlayer insulating layer 103 may be equal to the thickness of the second ILD (15 of FIG. 1) of the conventional art. According to the conventional art, the first metal interconnection (35 of FIG. 1) is formed over the first IMD (27 of FIG. 1) which is higher than the second ILD. Therefore, the local interconnection of the present invention i.e., the first metal interconnection 109b, may be formed at a lower level than in the conventional art. Thus, according o a preferred aspect of the present invention, the contact hole connecting the first metal interconnection 109b with an active contact on the semiconductor substrate may have a reduced step difference, compared to that of the conventional art. Also, the first metal interconnection 109b is composed of Pt-group elements, since it is obtained by patterning the first metal layer 109 which is also used for the lower electrode of the ferroelectric capacitor. Therefore, in contrast with the conventional metal interconnection method using aluminum, the contact resistance is not increased, even if a Ti layer is not used as an ohmic layer.

Figure 2D:
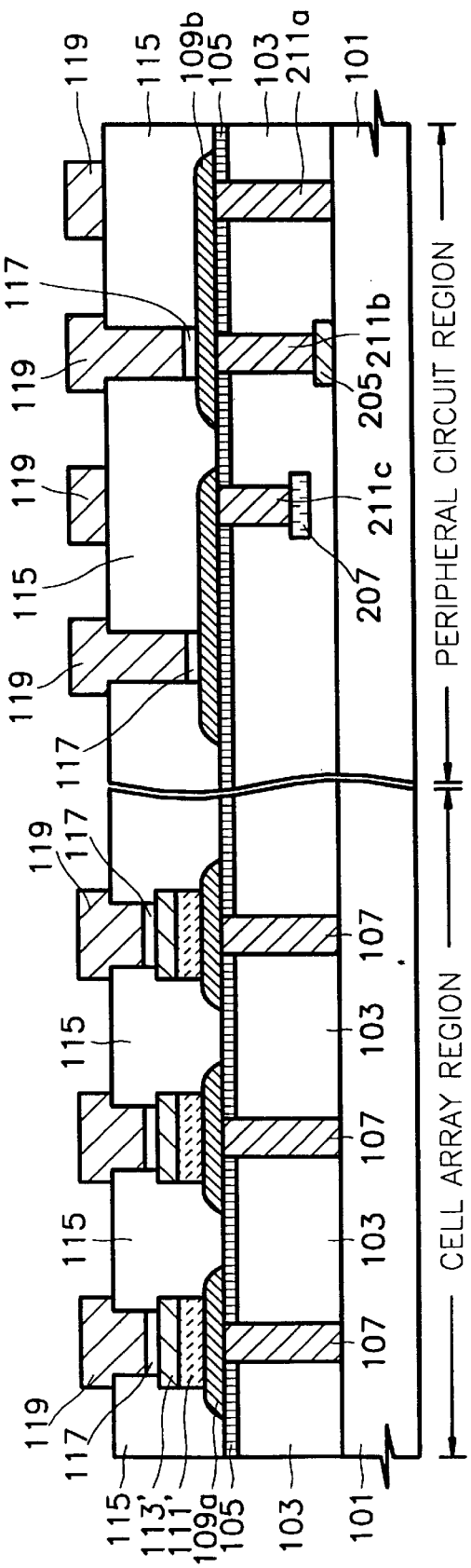

Referring to FIG. 2D, a second interlayer insulating layer 115 is formed over the resultant structures of the cell array region and the peripheral circuit region. In order to allow connection of the second metal interconnection 119, via holes are formed over the capacitor in the cell array region, and over the first metal interconnection 109b in the peripheral circuit region. A barrier layer 117 such as a TiN layer is formed at a bottom of each via hole. The second metal interconnection 119 composed of Al is then formed thereon.

In other words, in forming the second metal interconnection, only the TiN barrier layer is formed at the bottom of the via hole. The Ti layer as the ohmic layer is not formed. Therefore, the polarization characteristics of the ferroelectric capacitor in the cell array region is not degraded by Ti diffusion. Also, since the first metal interconnection 109b is made of a Pt-group element, a contact resistance between the first metal interconnection 109b and the second metal interconnection 119 in the peripheral circuit region is not increased, unlike in the case of an Al-to-Al contact. As described above, according to the present invention, a lower electrode material of a ferroelectric capacitor in the memory array region is also used as a metal interconnection in the peripheral circuit region. Specifically, high contact resistance in the peripheral circuit region and degradation of polarization characteristics of the ferroelectric capacitor in the cell array region are both eliminated by using the lower electrode material of a ferroelectric capacitor (e.g., Pt) as a metal interconnection in the peripheral circuit region. Accordingly, the need to use an ohmic layer in the peripheral circuit region to electrically couple a the first metal interconnection 109b to a second metal interconnection comprising aluminum is eliminated.

Although the present invention has been described with reference to specific embodiments, this description is not meant to be construed in a limited sense. Even though not described through the embodiments, what is evident to one skilled in the art must be construed to fall under the spirit or scope of the invention. For example, it is evident to an ordinary person skilled in the art that the ferroelectric capacitor can be substituted with a high dielectric capacitor employing a high dielectric material such as $Ta_2O_5$. When employing the high dielectric material, the first metal layer in FIG. 2A may be patterned to form a lower electrode and a local interconnection in the cell array region and the peripheral circuit region, respectively, before the step of forming a dielectric material layer and an upper electrode material layer. In this case, the upper electrode can be formed over the entire cell array region.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming an integrated circuit memory device, comprising the steps of:

forming a first electrically insulating layer on a semiconductor substrate containing memory cells in an array region and peripheral circuits for driving the memory cells in a peripheral circuit region adjacent the array region;

patterning a first electrically conductive layer as a first electrode of a capacitor extending opposite the array region and as a first interconnection layer extending opposite the peripheral circuit region;

forming a dielectric region on the first electrode;

forming a second electrode of the capacitor on the dielectric region, opposite the first electrode;

forming a second electrically insulating layer on the second electrode and on first interconnection layer;

forming first and second vias in the second electrically insulating layer, to expose the second electrode and the first interconnection layer, respectively; and patterning a second electrically conductive layer in the first and second vias.

2. The method of claim 1, wherein said step of forming a first electrically insulating layer comprises forming a first electrically insulating layer having first and second contact holes therein extending opposite the array region and peripheral circuit region, respectively, and forming first and second conductive contact plugs in the first and second contact holes, respectively.

3. The method of claim 1, wherein said step of patterning a first electrically conductive layer is preceded by the step of forming an etch-stopping layer on the first electrically insulating layer; and wherein said steps of patterning a first electrically conductive layer, forming a dielectric region and forming a second electrode comprise the steps of forming a first electrically conductive layer on the etch-stopping layer, forming a dielectric layer on the first electrically conductive layer, forming a second electrode layer on the dielectric layer, etching the second electrode layer and dielectric layer using a first mask to expose the first electrically conductive layer and then etching the first electrically conductive layer using a second mask to define the first electrode and the first interconnection layer.

4. The method of claim 3, wherein said step of patterning the second electrically conductive layer in the first and second vias is preceded by the step of forming TiN diffusion barrier regions in the first and second vias.

5. The method of claim 4, wherein said step of patterning a first electrically conductive layer comprises the step of depositing a layer of platinum on the etch-stopping layer.

6. The method of claim 5, wherein said step of forming TiN diffusion barrier regions in the first and second vias comprises forming TiN diffusion barrier regions in contact with the second electrode and the first interconnection layer.

7. The method of claim 6, wherein said step of patterning a second electrically conductive layer comprises depositing a layer of aluminum in the first and second vias, in contact with the TiN diffusion barrier regions.

8. The method of claim 7, wherein the dielectric layer comprises a ferroelectric material.

9. The method of claim 7, wherein the dielectric layer comprises $Ta_2O_5$.

* * * * *